United States Patent [19]

Takenaka

[11] Patent Number: 4,999,279
[45] Date of Patent: Mar. 12, 1991

[54] PHOTOSENSITIVE RESIN COMPOSITION

[75] Inventor: Shigeo Takenaka, Ohtsu, Japan

[73] Assignee: Toyo Boseki Kabushiki Kaisha, Osaka, Japan

[21] Appl. No.: 296,101

[22] Filed: Jan. 12, 1989

[30] Foreign Application Priority Data

Jan. 13, 1988 [JP] Japan .................. 63-006567

[51] Int. Cl.$^5$ .................. G03F 7/031; G03C 1/735
[52] U.S. Cl. .................. 430/781; 430/288; 430/375; 430/906; 430/917; 522/65
[58] Field of Search .............. 430/906, 287, 288, 917, 430/283, 281, 325; 522/65

[56] References Cited

U.S. PATENT DOCUMENTS

| | | | |
|---|---|---|---|
| 4,050,942 | 9/1977 | Nacoi | 430/288 |
| 4,053,317 | 10/1977 | Naka | 522/65 |
| 4,145,222 | 3/1979 | Etoh et al. | 430/906 |
| 4,188,222 | 2/1980 | Nezu | 430/284 |
| 4,198,241 | 4/1980 | Bronstert et al. | 522/65 |
| 4,421,840 | 12/1983 | Lehner et al. | 430/273 |
| 4,544,624 | 10/1985 | Nanpai et al. | 430/281 |

FOREIGN PATENT DOCUMENTS 3619698 6/1986 Fed. Rep. of Germany ...... 430/906

Primary Examiner—Marion E. McCamish
Assistant Examiner—Christopher D. R. RoDee
Attorney, Agent, or Firm—Wegner, Cantor, Mueller & Player

[57] ABSTRACT

A photosensitive resin composition suitable for a water-developing type photosensitive resin plate as a patrix of a matrix for a rubber plate which comprises a basic nitrogen containing polyamide; a monomer having polymeric unsaturated bond; a compound of the formula (I):

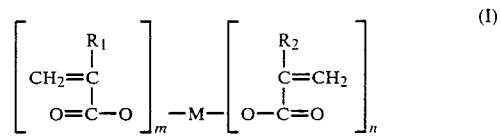

wherein $R_1$ and $R_2$ are the same or different and are hydrogen, alkyl, aryl or a derivative thereof; m and n are integers of 0 to 2 and the sum of m and n is 1 to 3; and M is an alkaline metal, an alkaline earth metal or a transition metal, and a N-nitrosoamine compound of the formula (II) of the formula:

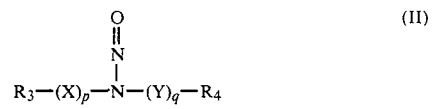

wherein $R_3$ and $R_4$ are the same or different and are halogen, hydroxyl, carboxyl, alkyl, cycloalkyl, optionally substituted aryl or acyl group; X and Y are carbonyl or —O—; and p and q are 1 or 0, or a salt thereof.

5 Claims, No Drawings

PHOTOSENSITIVE RESIN COMPOSITION

FIELD OF THE INVENTION

The present invention relates to a photosensitive resin composition. More particularly, the composition of the present invention is suitable for a printing material for producing a matrix which is used for producing a rubber plate.

BACKGROUND OF THE INVENTION

In general, photosensitive resin printing plates are divided into those developed with alcohols (alcohol-developing type plates), those developed with alkalis (alkali-developing type plates) and those developed with water (water-developing type plates). At present, water-developing type plates are predominantly used from the viewpoints of easy handling and less problems of waste liquor. As the base polymers of water-developing type photosensitive resin plates, there have been known water-soluble polyvinyl acetate polymers, N-polyvinyl pyrrolidone polymers, polyvinyl alcohol polymers and the like. Most of them have thermosetting properties or less thermoplastic properties. Then, when a resin printing plate is produced by using the base polymer, a solution of the polymer is cast. However, casting is inefficient in comparison with melt molding. On the other hand, when polyamide polymers are used as the base polymers, thermoplasticity can be provided. Therefore, melt molding can be employed and the production can be carried out efficiently. However, the polymers are not suitable for use at a high temperature under a high pressure, for example, as a printing material to produce a matrix which is used for the production of a rubber plate.

That is, in the case of the production of a rubber plate (printing plate, stamp and the like), it is necessary to make a mold for rubber, i.e., a matrix. For this purpose, there has been used phenol resin powder or a matrix board obtained by coating phenol resin on a board. The matrix is produced by using an etched metal plate or a relief made of a photosensitive resin plate as a patrix (original) and pressing the above phenol resin powder or a matrix board with the patrix at a high temperature under a high pressure, for example, at 130° to 150° C. under 20 to 50 kg/cm² to cure the phenol resin.

As the patrix, an etched zinc plate of 0.5 to 4 mm in thickness was often used. However, there were problems of handling and treatment of waste liquor. Therefore, recently, a relief made of a photosensitive resin plate of 0.5 to 4 mm in thickness has been often used rather than the etched metal plate. And, as described above, a water-developing type photosensitive resin plate is predominantly used. Particularly, in the photosensitive resin of such a water-developing type plate, there is predominantly used a combination of heat-resistant PVA (polyvinyl alcohol) as a binder and a crosslinking agent. However, PVA contained in this combination is not thermoplastic and, therefore, casting should be employed for producing a thick resin plate and, in the case of the production of a resin plate having such a thickness as thick as 1.5 to 4 mm, there is employed an inefficient process such as repetition of casting several times to pile up layers. Thus, it has been desired to use a thermoplastic polymer having resistance to a high temperature under a high pressure which can be subjected to continuous molding.

In order to provide a thermoplastic polymer with both heat resistance and pressure resistance, several methods can be considered. For example, there is a method wherein a photosensitizing group is introduced into a polymer itself to form a crosslinked polymer. However, there is a problem of insufficient stability during the production of the polymer and a photosensitive resin plate. Further, selection of a crosslinking agent which can provide a high crosslinking density is also considered. However, mere increase in the crosslinking density does not provide sufficient properties. Although Japanese Patent Kokoku No. 47-45584 discloses that the combination of a polyamide and a metal salt of an organic acid having an unsaturated bond as a crosslinking agent provides a composition having improved compatibility, the composition is impractical because storage stability is extremely inferior due to the metal salt and, therefore, heat polymerization is readily caused by a dark reaction. Japanese Patent Kokoku No. 46-9284 discloses a composition composed of a polyamide and a nitroso compound. However, there is no disclosure about a water-developing type plate.

OBJECTS OF THE INVENTION

The present inventors have intensively studied to solve the problems of the above thermoplastic polymer used for a base polymer of the photosensitive resin printing plates. As the results, it has been found that a certain thermoplastic polyamide polymer composition is suitable for this purpose.

That is, the main object of the present invention is to provide a photosensitive resin composition which can be suitably used as a printing material for producing a matrix printing plate for producing a rubber plate and has resistance to both high temperature and high pressure as well as excellent plate-making properties such as storage stability, fine line retention, resolving power and the like.

This object as well as other objects and advantages of the present invention will become apparent to those skilled in the art from the following description.

SUMMARY OF THE INVENTION

According to the present invention, there is provided a photosensitive resin composition which comprises:
  a basic nitrogen-containing polyamide (A),
  a monomer having a polymerizable unsaturated bond (B),
  a compound (C) of the formula (I):

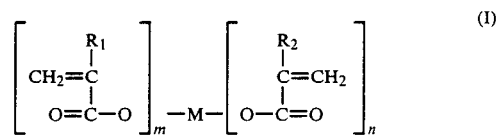

wherein $R_1$ and $R_2$ are the same or different and are hydrogen, alkyl, aryl or a derivative thereof; m and n are integers of 0 to 2 and the sum of m and n is 1 to 3; and M is an alkaline metal, an alkaline earth metal or a transition metal, and a N-nitrosoamine compound of the formula (II) or a salt thereof (D) of the formula:

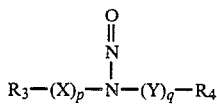

(II)

wherein $R_3$ and $R_4$ are the same or different and are halogen, hydroxyl, carboxyl, alkyl, cycloalkyl, optionally substituted aryl or acyl group; X and Y are carbonyl or —O—; and p and q are 1 or 0.

DETAILED DESCRIPTION OF THE INVENTION

In the composition of the present invention, the basic nitrogen containing polyamide (A) can be obtained, for example, by polycondensation of a monomer selected from the group consisting of basic nitrogen-containing monomers of the following formulas (III) to (VIII) in the following items (i) and (ii) (monomers having a lactam bond or a polymerizable functional group represented by A, B or Z as described hereinafter in the molecule) alone or in combination thereof, if desired, in combination with other suitable polymerizable monomers.

(i) monomer containing basic nitrogen atom in the main chain:

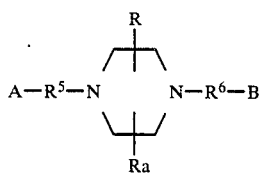

(III)

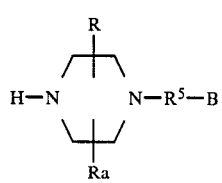

(IV)

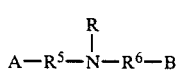

(V)

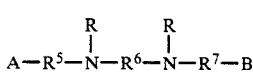

(VI)

In the above formulas (III) to (VI), R and Ra are hydrogen or alkyl having 1 to 10 carbon atoms such as methyl, ethyl, propyl, isopropyl, butyl, tert-butyl, pentyl, hexyl, heptyl, octyl, nonyl, decyl and the like. $R^5$, $R^6$ and $R^7$ are alkylene having 1 to 15 carbon atoms corresponding to the above alkyl and undecyl, tetradecyl, pentadecyl and the like. A and B are —NH$_2$, —COOH or —COORb. A and B may be the same or different. Rb is an alkyl group as that defined with respect to R and Ra.

(ii) monomer containing basic nitrogen atom in part of side chain:

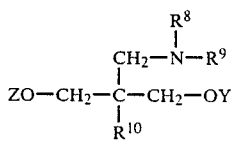

(VII)

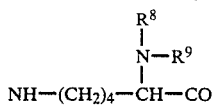

(VIII)

In the above formulas (VII) and (VIII), $R^8$ and $R^9$ are the same alkyl having 1 to 10 carbon atoms as defined above and $R^{10}$ is lower alkyl having 1 to 3 carbon atoms such as methyl, ethyl, propyl, isopropyl and the like or —CH$_2$—NR$_1$(R$_2$) And, Z is Y-aminopropyl group.

For example, the photosensitive resin composition of the present invention is composed of a polyamide resin obtained by polymerizing one or more monomers of the above formulas (III) to (VIII) as the base material thereof together with various components described hereinafter. The polyamide (A) used as the base material can be also obtained by copolymerization of a basic nitrogen containing monomer with a fatty acid and/or an aromatic dicarboxylic acid, diamine, ω-amino acid lactam and the like which are usually used for the production of a polyamide polymer.

Each component is explained below.

(a) The Compound Having Polymerizable Unsaturated Bond (B)

As the compound (B), for example, there can be used (meth)acrylamides [the term "(meth)acryl" used therein means both acryl and methacryl] such as (meth)acrylamide, N-methylol(meth)acrylamide, diacetone (meth)acrylamide, N-butyl (meth)acrylamide, methyl (meth)acrylate, 2-hydroxypropyl (meth)acrylate, tetrahydrofurfuryl (meth)acrylate, N,N'-methylene bis(meth)acrylamide, N,N'-trimethylene bis(meth)acrylamide, N,N'-hexamethylene bis(meth)acrylamide, N,N'-benzylidene bis(meth)acrylamide, N,N'-m-xylylene bis(meth)acrylamide, tri(meth)acryl formal and the like; (meth)acrylates such as ethylene glycol di(meth)acrylate, 1, 3-propanediol di(meth)acrylate, trimethylolpropane tri(meth)acrylate, pentaerythritol tri(meth)acrylate, pentaerythritol tetra(meth)acrylate, tris[(meth)acryloiloxyethyl]phosphate and the like; reaction products of epoxy compounds and unsaturated acids; reaction products of acryloyl group containing epoxy compounds and acids or amines; and the like. Preferably, the composition of the present invention contains the monomer (B) in an amount of 5 to 200 parts by weight per 100 parts by weight of the above polyamide (A). When the amount is less than 5 parts by weight, water resistance of a photo-setting product resulting from the reaction of the polyamide photosensitive resin composition of the present invention having an ammonium salt type nitrogen atom with a quaternizing agent described below becomes insufficient and, therefore, form retention of a relief becomes insufficient. On the other hand, when the content exceeds 200 parts by weight, fluidity of the photosensitive resin composition in an uncured state becomes too large and, therefore, it becomes difficult to retain in the shape of a film.

(b) The Compound (C) of the Above Formula (I)

In the formula (I), alkyl represented by $R_1$ and $R_2$ is that having 1 to 15 carbon atoms such as methyl, ethyl, propyl, butyl and the like. Aryl represented by $R_1$ and $R_2$ is that having 6 to 15 carbon atoms such as benzyl, phenylbutylene and naphtyl. The derivatives of alkyl and aryl include alkyl having 1 to 15 carbon atoms substituted with hydroxy (e.g., hydroxymethylene, hydroxyethylene) and aryl having 6 to 15 carbon atoms substituted with hydroxyl, carboxy, carbonyl, halogen, alkoxy, amino or nitro. In the present invention, preferably, $R_1$ and $R_2$ are different from each other. Examples of the alkali metal represented by M include lithium, sodium, potassium and the like. Examples of the alkaline earth metal represented by M include beryllium, magnesium, calcium, strontium, barium and the like. Examples of the transition metal include IIIB group metals such as aluminum and the like; IIB group metals such as zinc; iron; copper; nickel and the like. As the compound (C), for example, there can be used sodium (meth)acrylate, potassium (meth)acrylate, magnesium (meth)acrylate, magnesium acrylate methacrylate, calcium (meth)acrylate, zinc (meth)acrylate, aluminum (meth)acrylate and the like. In the present invention, magnesium acrylate methacrylate is especially preferred. Preferably, the composition of the present invention contains the compound (C) in an amount of 5 to 100 parts by weight, more preferably, 10 to 45 parts by weight per 100 parts by weight of the above polyamide (A). By using the compound (C), a crosslinking density can be improved and, further, heat resistance can be remarkably improved due to interaction of the metal and the polymer. When the amount exceeds 100 parts by weight, compatibility to the other components becomes extremely inferior depending upon the particular kinds of the metal or the organic acid contained.

(c) N-Nitrosoamine Compound or a Salt Thereof (D) of the Above Formula (II)

In the formula (II), halogen represented by $R_3$ and $R_4$ includes Cl, Br and the like. Alkyl represented by $R_3$ and $R_4$ includes that having 1 to 20 carbon atoms such as methyl, ethyl, propyl, butyl and pentyl. Cycloalkyl includes that having 3 to 20 carbon atoms such as cyclohexyl, cyclopentyl and cyclopropyl. Aryl includes that having 6 to 20 carbon atoms such as phenyl, naphtyl, anthryl and benzyl. Substituted aryl includes substituted phenyl such as hydroxyphenyl, p-methylphenyl and the like. Acyl includes that having 1 to 20 carbon atoms such as acetyl, propionyl and methacryloyl. $R_3$ and $R_4$ may be the same or different. The salt of the compound (D) includes ammonium salt, metallic salts thereof such as aluminum salt, zinc salt and the like. Examples of the compound D include N-nitrosophenylhydroxylamine, ammonium N-nitrosohydroxylamine, aluminum N-nitrosophenylhydroxylamine, N-nitrosodimethylamine, N-nitrosodiethylamine, N-nitrosodiprolylamine, N-nitrosobutylamine, N-nitroso-N-ethylbutylamine, N-nitroso-N-methylaniline, N-nitroso-N-methyl-2-hydroxyprolylamine, N-nitroso-N-methyl-2-oxopropylamine, N-nitroso-N-methylurethane, N-nitrosopyrrolidine, cupferron, N-nitrosopiperidine, N-nitrosodiphenylamine, N-nitrosodicyclohexylamine and the like. Preferably, the composition of the present invention contains the compound (D) in an amount of 0.0001 to 2 parts by weight, more preferably, 0.01 to 0.4 parts by weight per the above 100 parts by weight of the polyamide resin (A). Thereby, heat polymerization of the polymerizable unsaturated bond containing compound and the organic acid metal salt is sufficiently inhibited to stabilize the composition. When the amount is more than 2 parts by weight, it is not preferred because it adversely affects photo-setting reaction.

In the composition of the present invention, a quaternizing agent is also contained for converting the basic tertiary amine group of the polyamide (A) into an ammonium salt type quaternary nitrogen atom. As the quaternizing agent, there can be used proton acids, alkyl halides, combinations of epoxy compounds and proton acids and the like. An amount of the quaternizing agent is appropriately selected according to the amount of the basic tertiary amino group existing in the polyamide, solubility in water and the like. In general, the amount is preferably 0.05 to 5 mol, particularly 0.10 to 2 mol per 1 mol of the basic tertiary amino group in the polymer.

Optionally, the composition of the present invention can contain a photopolymerization initiator. Such an initiator is a compound which initiates the polymerization reaction of the compound having polymeric unsaturated bond and, at the same time, contributes to acceleration of the reaction and curing in the formation of the photo-setting product. Any of compounds known as conventional sensitizers for photopolymerization of unsaturated compounds can be used alone or in combination thereof. Examples thereof include benzophenones, benzoins, benzyls, anthraquinones and the like. The amount of the photopolymerization initiator is preferably 0.01 to 10% by weight, more preferably, 0.05 to 5% by weight based on the total amount of the photosensitive resin composition.

Furthermore, optionally, the photosensitive composition of the present invention can contain a heat polymerization-inhibitor. The heat polymerization-inhibitor prevents heat polymerization in blending, molding and processing of the photosensitive resin composition as well as dark reaction in storing the composition. Examples of the heat polymerization-inhibitor include hydroquinone alkyl ether and the like. Optionally, the composition further contains other additives such as plasticizers, colorants and the like.

The composition of the present invention can be produced according to a standard method such as mixing, dispersing and/or dissolving the desired components. For example, each component can be mixed by using a solvent such as an alcohol or the like.

The composition can be used for the production of a printing material according to a known method. For example, the composition can be formed into a film by means of casting or, after removing a solvent, the composition is laminated on a desired base plate by means of extrusion method, rolling method, press method or the like. As the base plate, there can be used metal plates such as copper, aluminum, iron and the like; plates whose surfaces are plated; polyethylene terephthalate films; glass; and the like.

The photosensitive resin composition of the present invention can be readily molded because the thermoplastic polyamide is employed as the base polymer. Further, it has resistance to both high temperature and high pressure as well as excellent plate-making properties such as storage stability, fine line retention, resolving power and the like and, therefore, it can be preferably used as a printing material for producing a matrix according to a known method.

The following Examples and Comparative Examples further illustrate the present invention in detail but are not to be construed to limit the scope thereof.

All the "parts" in Examples and Comparative Examples are by weight unless otherwise stated.

EXAMPLES 1 TO 3 AND COMPARATIVE EXAMPLES 1 AND 2

A polyamide polymer (50 parts) having a relative viscosity of 2.50 which was obtained from ε-caprolactam (55 parts) and N,N'-bis(γ-aminopropyl)piperazine adipate (45 parts), a reaction product (35 parts) of ethylene glycol diglycidyl ether with acrylic acid, benzoin methyl ether (1 part) and methacrylic acid (3 parts) were dissolved in methanol (200 parts) with heating. To this polymer solution were added compounds shown in Table 1, respectively, to obtain a uniform clear solution.

The resulting solution was cast on a Teflon (the trade name of PTFE manufactured by E. I. Du Pont de Nemours & Co., Inc.) sheet and methanol was removed by air-drying in a dark place and then it was dried at 40° C. for 16 hours under vacuum. The sheet of the uniform transparent photosensitive resin composition thus obtained was heat bonded to a polyester film of 188 μm in thickness to prepare a photosensitive resin plate of 900 μm in thickness which had the photosensitive resin layer of the composition.

The photosensitive resin plate was blanked with a dumbbell (manufactured by Toyo Seiki Co., Ltd., Japan) into a sample piece of 10 mm in width × 50 mm in length and exposed to a 25 W chemical lamp for 10 minutes. Then, it was dipped in water at 20° C. for 2 minutes, dried at 70° C. for 10 minutes with a dryer and again exposed for 10 minutes to obtain a test sample. After the sample was allowed to stand at 150° C. for 2.5 minutes, its tensile strength and modulus were determined with a heating Tensilon. The results are also shown in Table 1.

TABLE 1

| Sample No. | Additives | Amount (part) | Tensile Strength at 150° C. (kg/cm²) | Modulus (kg/cm² %) |
|---|---|---|---|---|
| Example 1 | calcium acrylate | 5 | 15 | 1.2 |
|  | N-nitrosohydroxylaniline | 0.02 |  |  |
| Example 2 | calcium acrylate | 10 | 23 | 2.0 |
|  | N-nitrosohydroxylaniline | 0.02 |  |  |
| Example 3 | calcium acrylate-methacrylate | 10 | 40 | 2.5 |
|  | N-nitrosohydroxylaniline | 0.02 |  |  |
| Comp. Example 1 | reaction product of ethylene glycol diglycidyl ether and acrylic acid | 10 | 6 | 0.6 |
|  | N-nitrosohydroxylaniline | 0.02 |  |  |
| Comp. Example 2 | reaction product of ethylene glycol diglycidyl ether and methacrylic acid | 10 | 8 | 0.8 |
|  | N-nitrosohydroxylaniline | 0.02 |  |  |

As shown in Table 1, the tensile strength and modulus at 150° C. of the sample obtained according to the present invention are extremely improved.

EXAMPLES 4 AND 5 AND COMPARATIVE EXAMPLES 3 to 5

To the polymer solution obtained according to the same manner as described in Example 1 were added the compounds shown in Table 2, respectively. Aging stability of the resulting solution was determined by measuring the time required for rendering the solution water insoluble due to gelation at 130° C. Further, a gray scale (15 steps guide, manufactured by Dainippon Screen Co., Ltd., Japan) was adhered to the sample under vacuum and exposed to a 25 W chemical lamp for 5 minutes and then rinsed in water to remove the unexposed part. The number of the steps were observed. The results are also shown in Table 2.

TABLE 2

| Sample No. | Additives | Amount (part) | Gelling time at 130° C. (minutes) | Number of exposed steps |
|---|---|---|---|---|
| Example 4 | calcium acrylate | 10 | ≧120 | 13.5 |
|  | N-nitrosohydroxylamine ammonium salt | 0.02 |  |  |
| Example 5 | calcium acrylate | 10 | ≧120 | 12.5 |
|  | N-nitrosohydroxylamine alminium salt | 0.02 |  |  |
| Comp. Example 3 | calcium acrylate | 10 | 2 | 14 |
| Comp. Example 4 | calcium acrylate | 10 | 10 | 14 |
|  | hydroquinone monomethyl ether | 0.1 |  |  |
| Comp. Example 5 | calcium acrylate | 10 | 60 | 11 |
|  | hydroquinone monomethyl ether | 2.0 |  |  |

As shown in Table 2, in the composition of the present invention, heat polymerization such as dark reaction and the like are effectively inhibited and photo-setting is scarcely affected.

What is claimed is:

1. A photosensitive resin composition which comprises
a basic nitrogen-containing polyamide (A),
a monomer having a polymerizable unsaturated bond (B),
a compound (C) of the formula (I):

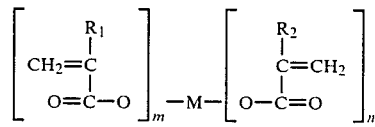

(I)

wherein $R_1$ and $R_2$ are the same or different and are hydrogen, alkyl, aryl or a derivative thereof; m and n are integers of 0 to 2 and the sum of m and n is 1 to 3; wherein M is an alkaline metal, an alkaline earth metal or a transition metal, and a compound of N-nitrosoamine compound of the formula (II) or a salt thereof (D) of the formula:

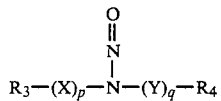  (II)

wherein $R_3$ and $R_4$ are the same or different and are halogen, hydroxyl, carboxyl, alkyl, cycloalkyl, optionally substituted aryl or acyl group; X and Y are carbonyl or —O—; and p and q are 1 or 0.

2. A photosensitive composition according to claim 6, wherein the composition contains 5 to 200 parts by weight of the monomer (B), 5 to 100 parts by weight of the compound (C) and 0.001 to 2 parts by weight of the compound (D) per 100 parts by weight of the polyamide (A).

3. A photosensitive composition according to claim 6, wherein the composition further contains a quaternizing agent in an amount of 0.05 to 5 mol per 1 mol of the basic tertiary amino group in the polyamide (A).

4. A photosensitive composition according to claim 6, wherein the composition further contains 0.01 to 10% by weight of the photopolymerization initiator based on the total amount of the composition.

5. A method of using a photosensitive composition comprising the steps of (a) image-wise exposing the composition to sufficient radiant energy to cure the composition in exposed areas therein to create a latent image and (b) washing the exposed composition with water to develop the latent image, wherein the photosensitive composition comprises a basic nitrogen-containing polyamide (A), a monomer having a polymerizable unsaturated bond (B), a compound (C) of the formula (I):

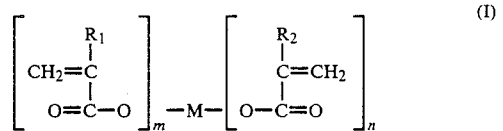  (I)

wherein $R_1$ and $R_2$ are the same or different and are hydrogen, alkyl, aryl or a derivative thereof; m and n are integers of 0 to 2 and the sum of m and n is 1 to 3; wherein M is an alkaline metal, an alkaline earth metal or a transition metal, and a compound of N-nitrosamine compound of the formula (II) or a salt thereof (D) of the formula:

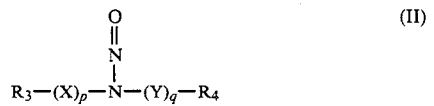  (II)

wherein $R_3$ and $R_4$ are the same or different and are halogen, hydroxyl, carboxyl, alkyl, cycloalkyl, optionally substituted aryl or acyl group; X and Y are carbonyl or —O—; and p and q are 1 or 0.

* * * * *